(12) United States Patent
Yang et al.

(10) Patent No.: US 6,878,622 B1
(45) Date of Patent: Apr. 12, 2005

(54) METHOD FOR FORMING SAC USING A DIELECTRIC AS A BARC AND FICD ENLARGER

(75) Inventors: Wenge Yang, Fremont, CA (US); Ramkumar Subramanian, San Jose, CA (US); Fei Wang, San Jose, CA (US); Lewis Shen, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/612,554

(22) Filed: Jul. 1, 2003

Related U.S. Application Data

(62) Division of application No. 09/974,917, filed on Oct. 10, 2001, now abandoned.
(60) Provisional application No. 60/239,395, filed on Oct. 10, 2000.

(51) Int. Cl.[7] .................. H01L 21/4763; H01L 21/44; H01L 21/311; H01L 21/302
(52) U.S. Cl. .................. 438/640; 438/673; 438/701; 438/713
(58) Field of Search .................. 438/640, 673, 438/701, 713

(56) References Cited

U.S. PATENT DOCUMENTS

| | | | | |
|---|---|---|---|---|
| 4,902,377 A | * | 2/1990 | Berglund et al. | 438/640 |
| 5,399,532 A | * | 3/1995 | Lee et al. | 438/597 |
| 5,750,441 A | * | 5/1998 | Figura et al. | 438/751 |
| 6,060,385 A | * | 5/2000 | Givens | 438/626 |
| 6,271,117 B1 | * | 8/2001 | Cherng | 438/624 |
| 6,392,310 B1 | * | 5/2002 | Matsunaga | 257/296 |
| 6,407,002 B1 | * | 6/2002 | Lin et al. | 438/713 |
| 6,731,008 B1 | * | 5/2004 | Tomita et al. | 257/774 |

* cited by examiner

Primary Examiner—Carl Whitehead, Jr.
Assistant Examiner—David L. Hogans
(74) Attorney, Agent, or Firm—Mikio Ishimaru

(57) ABSTRACT

A method is provided for manufacturing a semiconductor device on a semiconductor substrate using a dielectric as a bottom anti-reflective coating for formation of a photoresist contact opening which is used to enlarge the Final Inspection Critical Dimension (FICD) of the conductive contact. A high selectivity etch is used to form a tapered contact.

10 Claims, 8 Drawing Sheets

METHOD FOR FORMING SAC USING A DIELECTRIC AS A BARC AND FICD ENLARGER

CROSS-REFERENCE TO RELATED APPLICATION(S)

This is a divisional of U.S. patent application Ser. No. 09/974,917 filed Oct. 10, 2001, now abandoned, which claims priority from U.S. Provisional Patent Application No. 60/239,395 filed on Oct. 10, 2000, which are incorporated herein by reference thereto.

TECHNICAL FIELD

The present invention relates generally to semiconductors and more specifically to an improved fabrication process for making Self-Aligned Contact (SAC) semiconductor memory devices using a dielectric material (SiON) for a Bottom Anti-Reflective Coating (BARC) and a Final Inspection Critical Dimension (FICD) enlarger.

BACKGROUND ART

In general, memory devices such as a Flash electrically erasable programmable read only memory (EEPROM) are known. EEPROMs are a class of nonvolatile memory devices that are programmed by hot electron injection and erased by Fowler-Nordheim tunneling.

Each memory cell is formed on a semiconductor substrate (i.e., a silicon die or chip), having a heavily doped drain region and a source region embedded therein. The source region further contains a lightly doped deeply diffused region and a more heavily doped shallow diffused region embedded into the substrate. A channel region separates the drain region and the source region. The memory cell further includes a multi-layer structure, commonly referred to as a "stacked gate" structure or word line. The stacked gate structure typically includes: a thin gate dielectric or tunnel oxide layer formed on the surface of substrate overlying the channel region; a polysilicon floating gate overlying the tunnel oxide; an interpoly dielectric overlying the floating gate; and a polysilicon control gate overlying the interpoly dielectric layer. Additional layers, such as a silicide layer (disposed on the control gate), a poly cap layer (disposed on the silicide layer), and a silicon oxynitride layer (disposed on the poly cap layer) may be formed over the control gate. A plurality of Flash EEPROM cells may be formed on a single substrate.

A Flash EEPROM also includes peripheral portions which typically include input/output circuitry for selectively addressing individual memory cells.

The process of forming Flash EEPROM cells is well-known and widely practiced throughout the semiconductor industry. After the formation of the memory cells, electrical connections, commonly known as "contacts", must be made to connect the stack gated structure, the source region and the drain regions to other part of the chip. The contact process starts with the formation of sidewall spacers around the stacked gate structures of each memory cell. An etch stop or liner layer, typically a nitride material such silicon nitride, is then formed over the entire substrate, including the stacked gate structure, using conventional techniques, such as chemical vapor deposition (CVD). A dielectric layer, generally of oxide such as such as boro-phospho-tetra-ethyl-ortho silicate (BPTEOS), is then deposited over the etch stop layer. A layer of photoresist is then placed over the dielectric layer and is photolithographically processed to form the pattern of contact openings. An anisotropic etch is then used to etch out portions of the dielectric layer to form source and drain contact openings in the oxide layer. The contact openings stop at the source and drain regions in the substrate. The photoresist is then stripped, and a conductive material, such as tungsten, is deposited over the dielectric layer and fills the source and drain contact openings to form so-called "self-aligned contacts" (conductive contacts). The substrate is then subjected to a chemical-mechanical planarization (CMP) process, which removes the conductive material above the dielectric layer to form the conductive contacts through a contact CMP process.

For miniaturization, it is desirable to form the self-aligned contacts as precisely and as finely as possible. However, the small geometry of the self-aligned contact mask for accomplishing this is a very difficult challenge for conventional lithographic processes.

A solution, which would allow further miniaturization of memory device without adversely affecting device performance or yield by increasing the process margin for the lithographic process has long been sought, but has eluded those skilled in the art. As the demand for higher performance devices and miniaturization continues at a rapid pace in the field of semiconductor, it is becoming more pressing that a solution be found.

DISCLOSURE OF THE INVENTION

The present invention provides a method for manufacturing a semiconductor device on a semiconductor substrate using the combination of a tapered opening in a bottom antireflective coating (BARC) and a tapered contact opening in a dielectric layer to permit a photoresist contact opening to be larger for a given contact opening so both the Develop Inspection Critical Dimension (DICD) and the Final Inspection Critical Dimension (FICD) are enlarged for a given line geometry. This permits placing the stacked gates closer together to shrink the size of the integrated circuits.

The present invention further provides a semiconductor device having a tapered contact, which permits the closer placement of the stacked gates to shrink the size of the integrated circuits.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
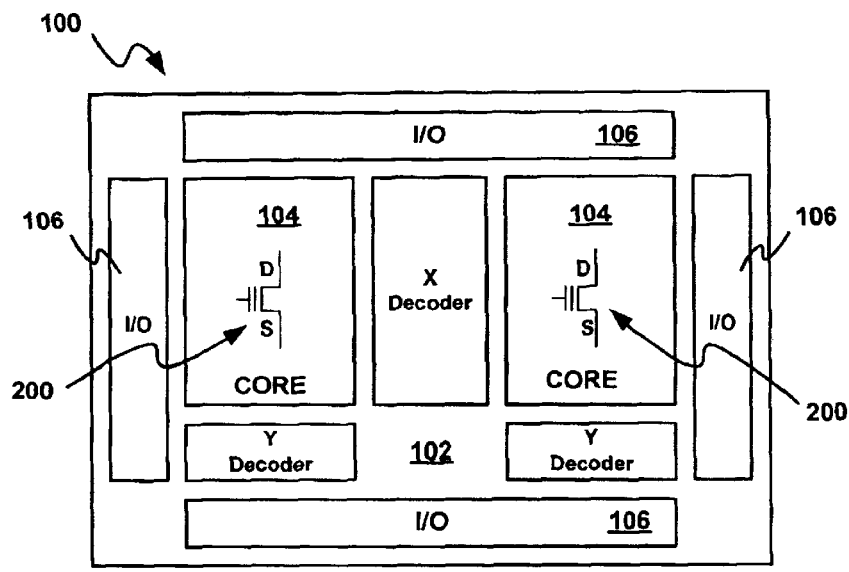
FIG. 1 (PRIOR ART) is a plan view of a conventional memory device.

Referring now to FIG. 1 (PRIOR ART), therein is shown a plan view of a conventional memory device, a Flash EEPROM 100 which commonly includes a semiconductor substrate 102 in which one or more high-density core regions and one or more low-density peripheral portions are formed. High-density core regions typically include one or more M×N array cores 104 of individually addressable, substantially identical memory cells 200. Low-density peripheral portions 106 typically include input/output (I/O) circuitry and circuitry for selectively addressing the individual cells. The selective addressing circuitry typically includes one or more x-decoders and y-decoders, cooperating with the I/O circuitry for connecting the source, gate, and drain of selected addressed cells to predetermined voltages or impedances to effect designated operations on the cell, e.g., programming, reading and erasing, and deriving necessary voltages to effect such operations.

Figure 2A:
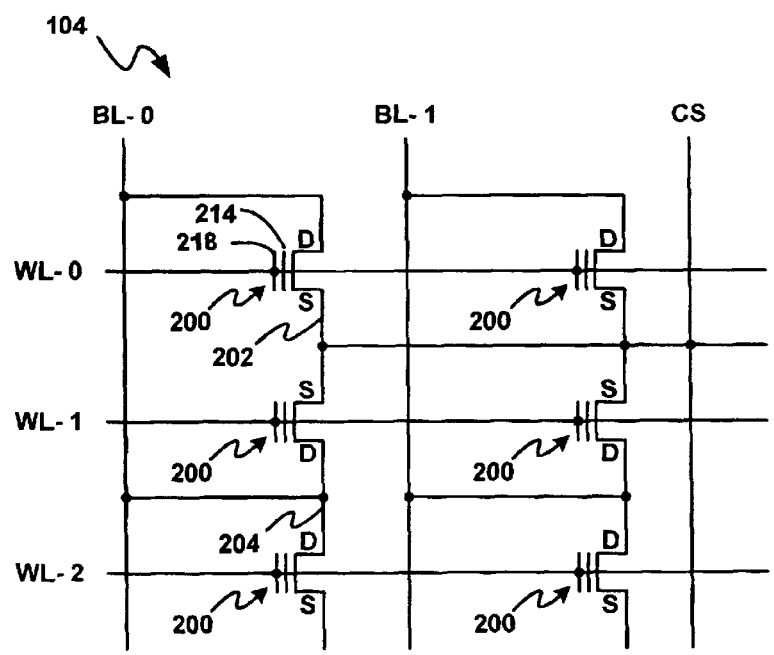
FIG. 2A (PRIOR ART) is a schematic diagram of a portion of a memory cell array.
Figure 2B:
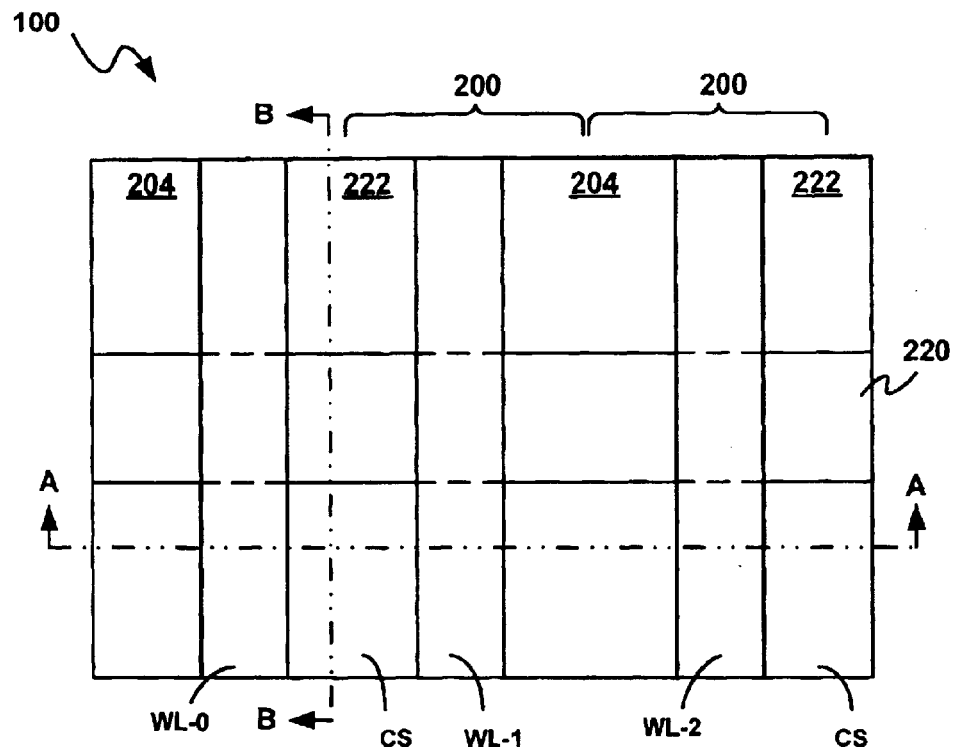
FIG. 2B (PRIOR ART) is a plan view of a portion of an intermediate state (partially complete) of a cell array core.
Figure 2C:
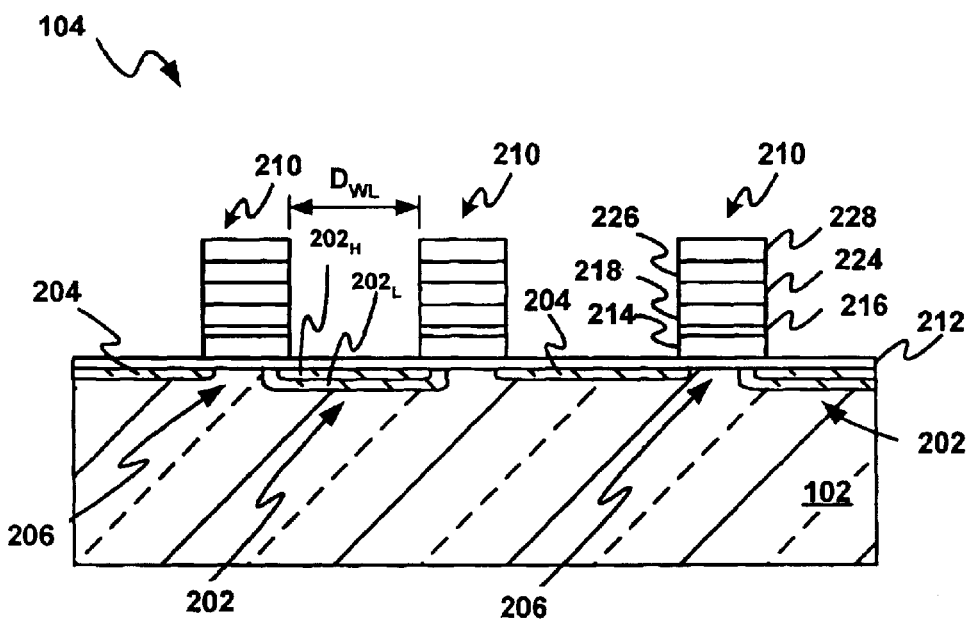
FIG. 2C (PRIOR ART) is a simplified cross section of FIG. 2B (PRIOR ART) along line A—A.

Referring now to FIG. 2A (PRIOR ART), therein is shown a schematic diagram of a portion of a memory cell array in which each cell 200 in array core 104 typically comprises: a source 202, a drain 204 and a channel 206 (shown in FIG. 2C (PRIOR ART)) semiconductor regions.

Referring now to FIG. 2B (PRIOR ART), therein is shown a plan view of a portion of an intermediate state (partially complete) of a cell array core 104.

Referring now to FIG. 2C (PRIOR ART), therein is shown a simplified cross-section of FIG. 2B (PRIOR ART) along line A—A. The source 202, drain 204, and channel 206 semiconductor regions are shown formed in semiconductor substrate 102 (or in an isolation well); and a multi-layer structure, commonly referred to as a "stacked gate" (word line) structure 210. Stacked gate structure 210 includes: thin gate dielectric layer 212 (commonly referred to as the "gate oxide") formed on the surface of semiconductor substrate 102 overlying channel 206; a floating gate 214 overlying the gate dielectric layer 212; an interpoly dielectric 216 overlying floating gate 214; and a control gate 218 overlying interpoly dielectric layer 216. Additional layers, such as a silicide layer 224 (disposed on the control gate 218), a poly cap layer 226 (disposed on the silicide layer 224), and a silicon oxynitride layer 228 (disposed on the poly cap layer 226) may be formed over the control gate 218. Cells 200 are arranged in a series of rows and columns.

In the completed array, the control gates 218 of the cells 200 in a row are formed integral to a common word line (WL) associated with the row. Columns of cells are arranged such that adjacent cells in a column share a common semiconductor region as a source or drain region. The source 202 of each cell in a column (excepting end cells) is formed in a common region with one of the adjacent cells, e.g., the preceding cell in the column. Likewise, the drain of the cell is formed in a common region with the drain 204 of the other adjacent cell, e.g., the next succeeding cell in the column (except end cells). The drain of each cell in a column of cells is connected by a conductive bit line (BL) (FIG. 2A (PRIOR ART)), including an overlying layer of metal connected to each drain 204 of the cells 200 within the column. Additionally, the sources of each cell 200 in a row (and hence pairs of rows) are interconnected by a common source line CS (FIGS. 2A (PRIOR ART)) formed in the semiconductor substrate 102, as will be described. Any particular cell 200 within the array cores 104 can be individually addressed (programmed and read) by operating upon one word line and one bit line.

Typically, in forming an EEPROM 100, a pattern of field oxide regions 220 (FIG. 2B) is initially formed to provide electrical isolation between the respective devices of EEPROM 100. For example, field oxide regions 220 are used to provide isolation between the array cores 104 and the devices of peripheral portions 106, as well as between the various columns of cells 200 within the array cores 104. Field oxide regions are conventionally formed using a mask and selective growth process: a layer of thermal oxide ("barrier oxide" or "pad oxide") is grown or deposited over the surface of the semiconductor substrate 102; a mask, frequently composed of nitride, is deposited on the barrier oxide, and patterned to cover those regions of the semiconductor substrate 102 in which devices are to be formed (herein referred to as active regions); field oxide is grown in the exposed areas of the barrier oxide, by for example, the local oxidation of silicon (LOCOS); and the masking layer and barrier oxide are stripped to expose the underlying semiconductor substrate 102. In general, referring to FIG. 2B (PRIOR ART), within the array cores 104, the selective growth process results in alternating parallel strips of field oxide regions 220 and exposed regions corresponding to the columns of cells 200 in the array.

Stacked gate word line structures 210 are then typically formed. For example, gate dielectric layer 212, suitably comprising a thin (e.g. approximately 100 angstroms) layer of oxide, is initially formed on the semiconductor substrate 102 by a suitable technique, such as, for example, thermally oxidizing the surface of the semiconductor substrate 102 or by depositing a suitable material on the semiconductor substrate 102. A layer of suitable conductive polysilicon (e.g., polycrystalline silicon), that will ultimately form the floating gates 214, is typically then formed on the gate dielectric layer 212. For example, conductive polysilicon may be deposited by any suitable technique, e.g., conventional chemical vapor deposition (CVD). The polysilicon layer is typically then masked and etched to remove strips overlying the field oxide regions 220, leaving isolated strips of polysilicon on top of the gate dielectric layer 212 overlying the substrate regions corresponding to the columns of cells 200 of the array core 104 (i.e. the regions in which source, channel, and drain regions of cells in the column will be formed). A layer of suitable dielectric material, such as, e.g., an oxide-nitride-oxide (ONO) layer, that will ultimately form interpoly dielectric 216 is typically then formed by a suitable technique. For example, where interpoly dielectric 216 is ONO, it is suitably formed by growing a layer of oxide, depositing a layer of nitride, followed by growing another layer of oxide. The interpoly dielectric 216 layer, in the completed array, insulates control gates 218 from floating gates 214 in the individual cells and electrically isolates the adjacent columns of the floating gates 214 in the array core 104. Another layer of conductive polysilicon (e.g., polycrystalline silicon), that will ultimately form the control gates 218 (and the word lines WL connecting the control gates of the cells in the respective rows of the array core 104) is typically then deposited on the interpoly dielectric layer, by a suitable technique, such as, for example, by conventional CVD. Portions of the respective polysilicon and interpoly dielectric layers are typically then selectively removed, to define the stacked gate structures 210 on the gate dielectric layer 212, i.e., to form the floating gates 214, the interpoly dielectric layer 216, and control gates 218 of the individual cells, and the word lines WL (portions of the interpoly dielectric 216 and control gate polysilicon layers, bridge field oxide regions 220, to connect the respective cells of the rows of the core array). This is typically effected by suitable masking and etching techniques.

When completed, this etch creates the respective, generally parallel, word line structures 210 separated by a distance $D_{WL}$, as shown in FIG. 2C (PRIOR ART). A silicide layer 224 is typically provided over the polysilicon layer 218 to reduce resistance. Thereafter, a polysilicon layer (commonly referred to as a "poly cap" layer) 226 is then formed over the silicide layer 224 to serve as a cap layer for the stacked gate structure 210. Next, a silicon oxynitride layer 228 may be formed over the poly cap layer 226. The combination of the poly cap layer 226 and the silicon oxynitride layer 228 are commonly referred to as a "passivation layer". Thereafter, portions of the poly cap layer 226 and the silicon oxynitride layer 228 are selectively removed using conventional masking and etching techniques to define the final stacked gate structure 210.

Conventionally, the portions of the field oxide regions 220 and the gate dielectric layer 212 between every second pair of adjacent word lines 210 in the array core 104 (i.e., the regions, generally indicated as 222, where the sources 202 are to be formed and the portions of the field oxide regions 220 disposed between sources 202 of the corresponding cells of adjacent columns) are then typically removed, in preparation for formation of the common line CS (not shown)) connecting the sources 202. This is typically effected using a conventional Self-Aligned Source (SAS) etch.

Figure 2D:
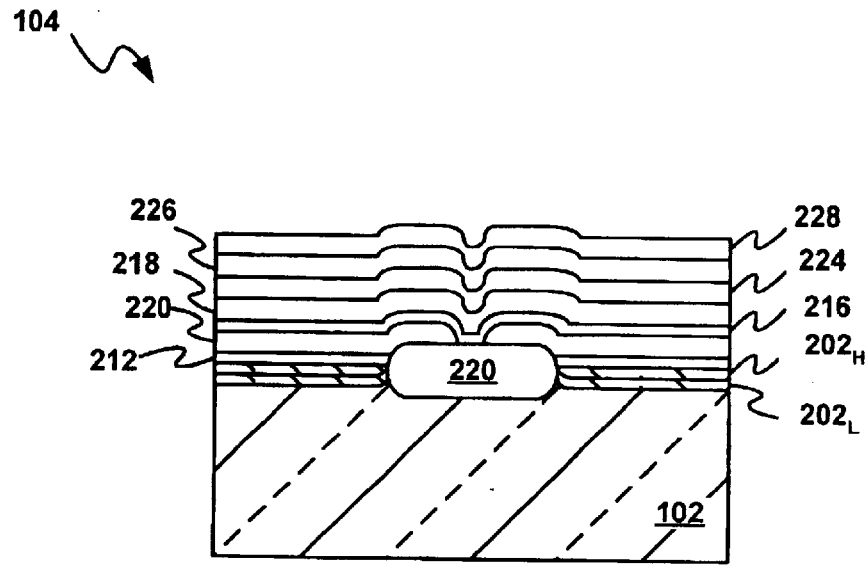
FIG. 2D (PRIOR ART) is a simplified cross section of FIG. 2B (PRIOR ART) along line B—B.

Referring now to FIG. 2D (PRIOR ART), therein are shown a simplified cross section of FIG. 2B (PRIOR ART) along line B—B for purposes of clarity.

In a conventional process, the source 202, common line CS, and drain 204 regions are then formed. The source 202 and the common source line CS are typically formed by initially effecting a conventional double diffusion implant (DDI), with the SAS mask still in place. The DDI implants a first dopant (e.g. n-type, such as phosphorous) to form a deeply diffused, but lightly doped, N well $202_L$ establishing a graded source-channel junction as shown in FIG. 2D (PRIOR ART). The SAS mask is then removed. The DDI implant is typically driven deeper into the substrate 102 by subjecting the substrate 102 to a thermal cycle at high temperature (e.g. 1050 degrees Celsius). A shallow second implant, commonly referred to as a medium diffused drain (MDD) implant, is then performed (e.g., with arsenic) to create a more heavily doped, but shallower, n+ well $202_H$ embedded within deep N well $202_L$. The MDD implant also forms a shallow, abrupt drain 204.

Figure 3A:
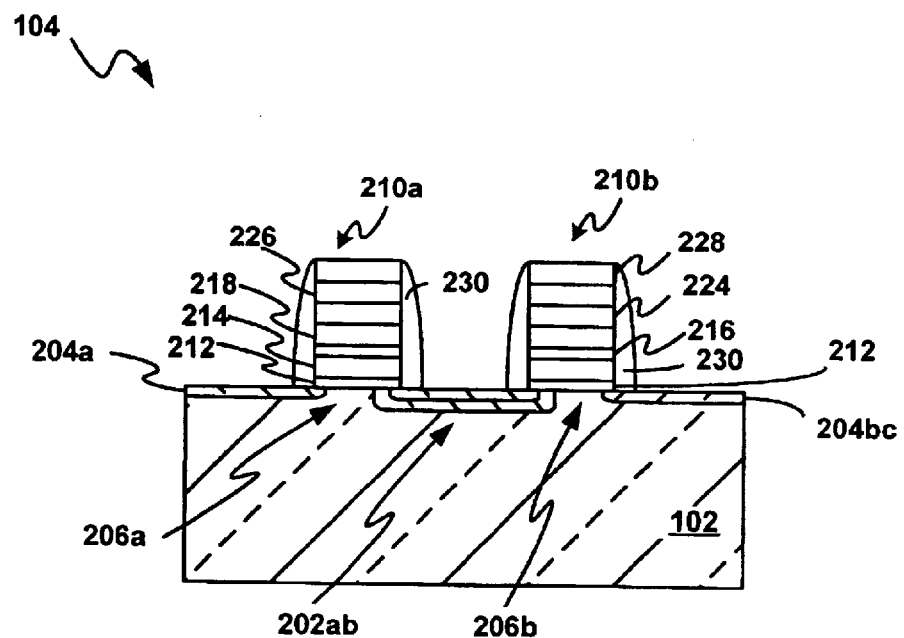
FIG. 3A (PRIOR ART) through 3E (PRIOR ART) illustrate the sequence of process steps of a conventional process for forming source/drain (S/D) contacts in a portion of a cell array core.

Referring now to FIGS. 3A (PRIOR ART) through 3E (PRIOR ART), therein is shown the sequence of process steps of a conventional process for forming source/drain (S/D) contacts in a portion of cell array core 104. FIG. 3A (PRIOR ART) shows the formation of sidewall spacers 230 around the stacked gate structures 210a and 210b formed on semiconductor substrate 102. At this stage are shown a channel region 206a separated by a drain 204a and a common source 202ab, and a channel region 206b separated by the common source 202ab and a common drain 202bc. The sidewall spacers 230 are typically formed of a nitride material using conventional deposition and etching techniques. Alternatively, the sidewall spacers 230 may be formed of an oxide material using chemical vapor deposition (CVD) followed by etching.

Figure 3B:
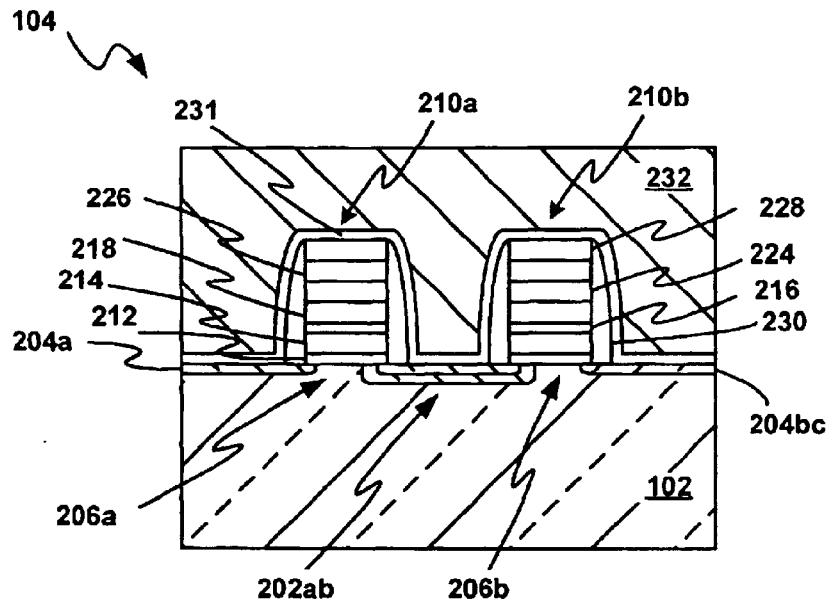

FIG. 3B (PRIOR ART) shows the deposition of an etch stop layer 231 over the entire substrate 102, including over the stacked gate structures 210a and 210b using conventional techniques, such as CVD. The etch stop layer 231 is typically formed of a nitride material such silicon nitride and is formed to a thickness typically in the range of approximately 30 to 120 nm. The etch stop layer 231 reduces the effective spacing between the stacked gate structures 210a and 210b. A dielectric layer 232 is then deposited over the etch stop layer 231. The dielectric layer 232 may include various oxides, such as boro-phospho-tetra-ethyl-ortho silicate (BPTEOS) or borophosphosilicate glass (BPSG), formed using plasma enhanced chemical vapor deposition (PECVD).

Figure 3C:
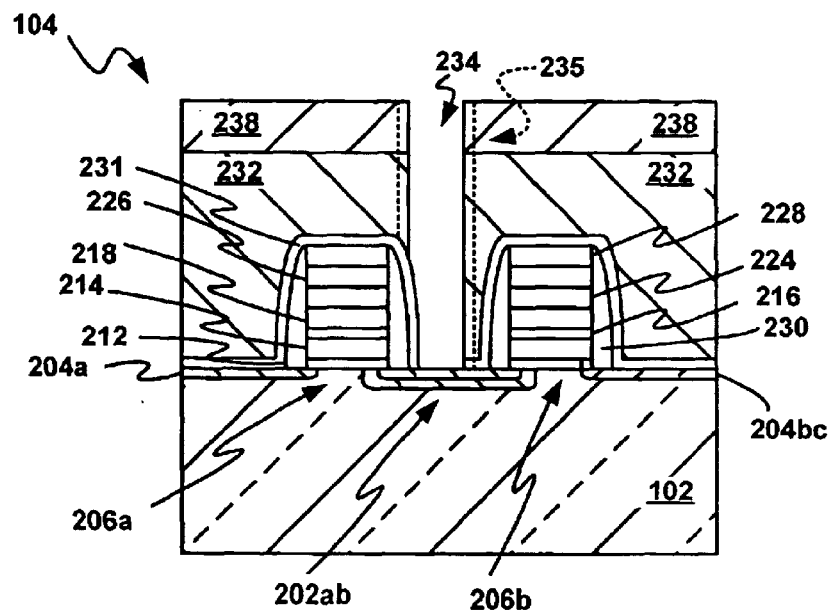

FIG. 3C (PRIOR ART) shows the formation of source/drain (SID) contact opening 234 in the dielectric layer 232, through etch stop layer 231, using a contact mask 238, to expose portions of the common source 202ab. For simplicity of illustration, only one contact opening 234 is shown. The contact opening 234 is formed conventionally using a two-step etch process. The first etch process is a conventional etch process, such as an oxide etch process, which stops at the etch stop layer 231. The second etch process is a conventional etch process, such as a nitride etch process, which removes portions of the etch stop layer 231 to expose portions of the common source 202ab.

An oversize contact opening 235 shows both the possibility of the contact opening 234 being oversize due to poor lithography at small critical dimensions and being misaligned so that the opening 234 does not fall properly on the common source 202ab. This may result in high contact resistance and poor reliability of the integrated circuit.

Figure 3D:
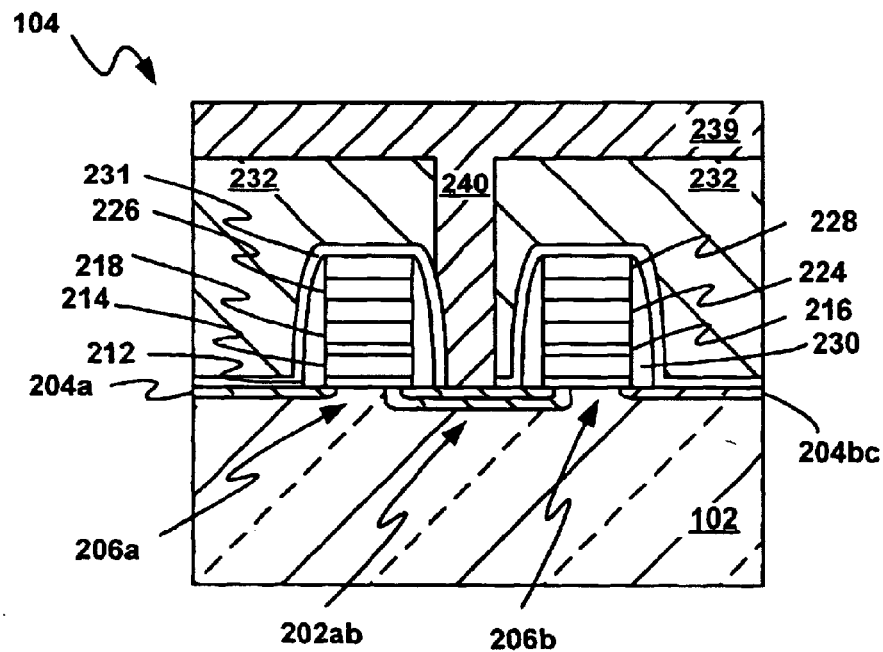

FIG. 3D (PRIOR ART) shows the removal of the contact mask 238 and the deposition of a conductive material to form a conductive layer 239 over the dielectric layer 232. The conductive material fills the contact opening 234 which will form a contact 240. The conductive material typically includes tungsten, aluminum, copper, gold, silver, etc., and may be formed using conventional metal deposition techniques, such as CVD and/or physical vapor deposition (PVD). A barrier material (not shown), such as titanium (Ti)/titanium nitride (TiN), is typically deposited to coat the walls of the contact opening 234 prior to the deposition of the conductive material to ensure good adhesion and electrical contact to the walls of the contact opening 234 and the underlying common source 202ab.

Figure 3E:
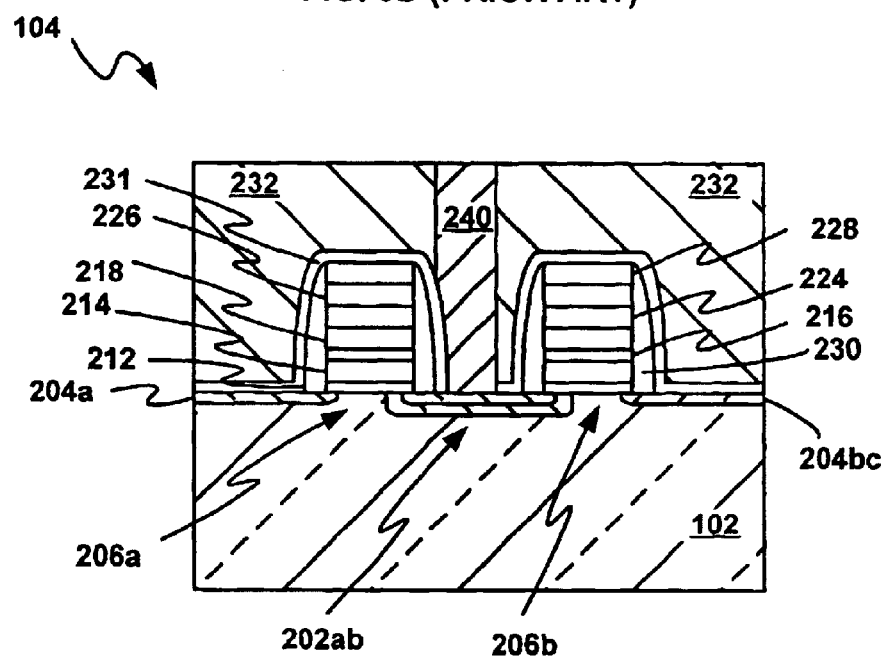

Referring now to FIG. 3E (PRIOR ART), therein is shown the removal of conductive material above the dielectric layer 232 using for example, chemical-mechanical polishing techniques. As shown, the contact 240 will have detrimentally high resistance since its entire cross section will not fall directly on the common source 202ab.

As explained in the BACKGROUND ART, one of the problems associated with the small geometry of the contact is that it is both difficult to form and to locate obtain the self-aligning contact. This is becoming critical as separation between adjacent stacked gate structures reduces and the line geometries shrink.

Referring now to FIGS. 4A through 4E, therein is shown the sequence of process steps for forming self-aligning contacts in accordance with the present invention for fabricating EEPROM device on a semiconductor substrate. For convenience of illustration, like reference numerals are used in FIG. 4A through 4G to denote like elements already described in FIGS. 1 (PRIOR ART), 2A (PRIOR ART) through 2D (PRIOR ART), and 3A (PRIOR ART) through 3E (PRIOR ART).

Figure 4A:
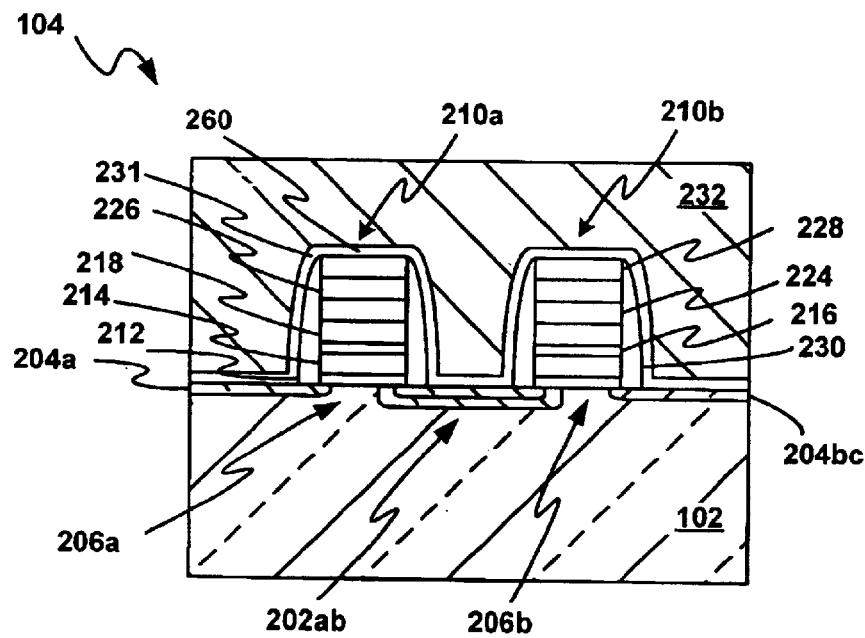
FIGS. 4A through 4F illustrate the sequence of process steps of a process in accordance with the present invention for forming source/drain (S/D) contacts in a portion of a cell array core.

FIG. 4A shows a partial, sectional view of an intermediate state (partially complete) of a portion of a cell array core 104, similar to what was shown in FIG. 3B. At this stage is shown a pair of stacked gate structures 210a and 210b formed on a semiconductor substrate 102. A common source 202*ab* is formed between the two stacked gate structures 210*a* and 210*b*. Drains 204*a* and 204*bc* are formed on the semiconductor substrate 102 and are spaced apart from the common source 202*ab* by channel regions 206*a* and 206*b*, respectively. Sidewall spacers 230 are formed around the stacked gate structures 210*a* and 210*b*. The sidewall spacers 230 may be formed of an oxide or nitride material using deposition and etching techniques. In this embodiment, sidewall spacers 230 are formed of a nitride material such as silicon nitride. After the sidewall spacers 230 are formed, a dielectric liner layer 231 of a material such as silicon nitride is formed over the entire semiconductor substrate 102, including the stacked gate structures 210*a* and 210*b*, sidewall spacers 230, common source 202*ab*, and drains 204*a* and 204*bc*. The dielectric liner layer 231 is in contact with the stacked gate structures 210*a* and 210*b*, sidewall spacers 230, common source 202*ab*, and drains 204*a* and 204*bc*. The deposition of the dielectric liner layer 231 is followed by the deposition of a dielectric layer 232 over and in contact with the dielectric liner layer 231.

In this embodiment, each of the stacked gate structures 210*a* (or 210*b*) includes a gate dielectric layer 212, such as an oxide layer, a floating gate 214 disposed on the gate dielectric layer 212, an interpoly (inter-gate) dielectric layer 216 disposed on the floating gate 214, a control gate 218 overlying the interpoly dielectric 216, a silicide layer 224 disposed on the control gate 218, a polysilicon (poly cap) layer 226 disposed on the silicide layer 224, and a silicon oxynitride layer 228 disposed on the poly cap layer 226.

Figure 4B:
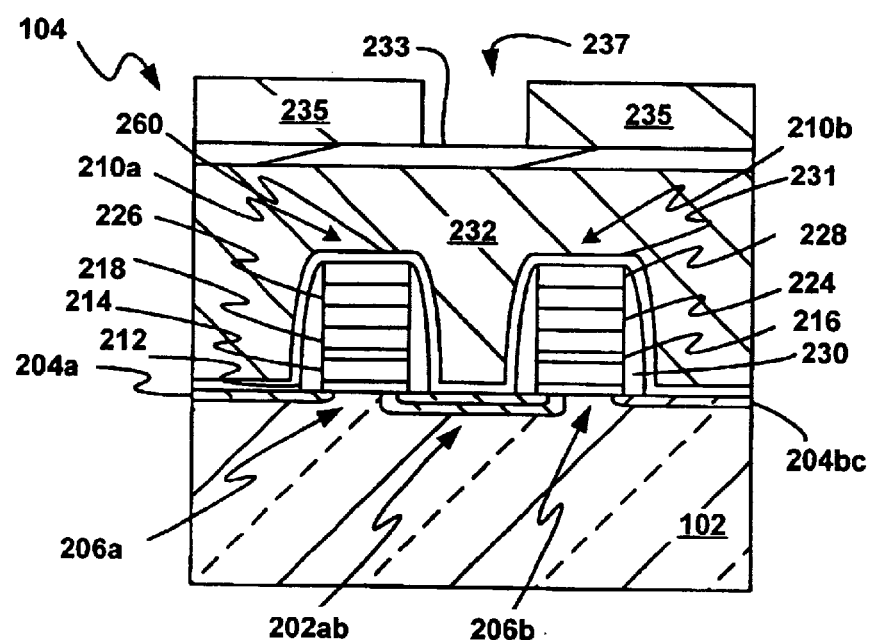

FIG. 4B shows the deposition of a Bottom Anti-Reflective Coating (BARC) 233, which in the Best Mode is silicon oxynitride (SiON), over the dielectric layer 232. A photoresist 235 is disposed over the BARC 233 and has been photolithographically patterned, exposed, and developed to form an oversize photoresist contact opening 237. The BARC 233 minimizes reflections from the dielectric layer 232 which could interfere with precise patterning and positioning of the photoresist contact opening 237.

Figure 4C:
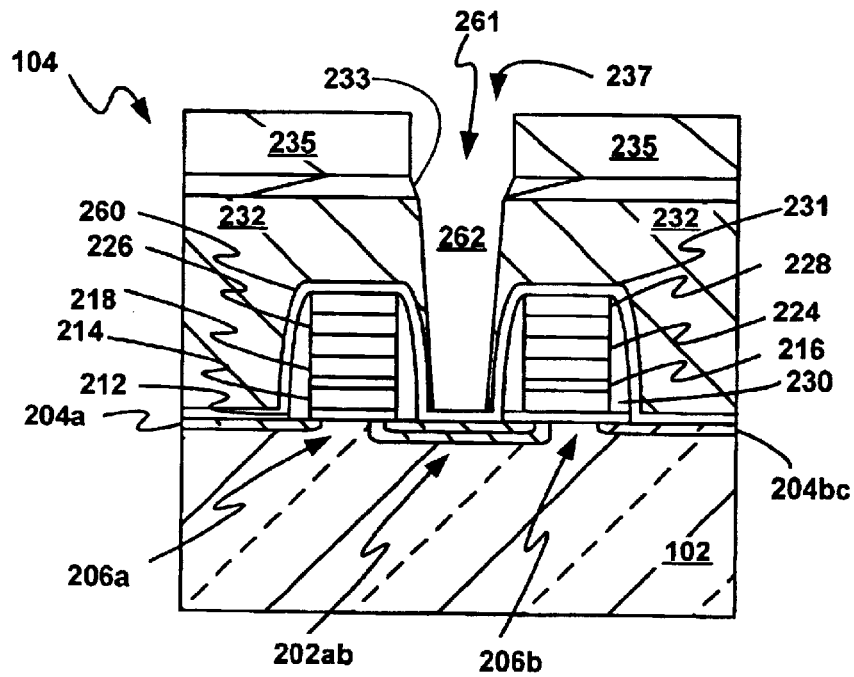

FIG. 4C shows the formation of source/drain (S/D) contact opening 262 in the dielectric layer 232 using the photoresist contact opening 237. A semi-isotropic etch is used which provides a tapered opening 261 through the BARC 233 which has a smaller diameter proximate the dielectric layer 232. The BARC 233 with the smaller diameter is used as a hard mask for the etching of the dielectric layer 232.

For simplicity of illustration, only one contact opening 262 is shown. To minimize etching of the sidewall spacers 230 and the underlying substrate 102, the contact opening 262 is formed using an oxide etch process with a sufficiently high selectivity, i.e., etching of the dielectric layer 232 is performed with reactive ions at a rate faster than the etch rate of the sidewall spacers and the underlying substrate 102. During the oxide etch process, the silicon oxynitride layers 228 act as protective layers for the stack gate structures 210*a* and 210*b* to avoid them from being etched.

In the present invention, the oxide etch is a semi-isotropic etch which provides a tapered S/D contact opening 262. The combination of the tapered opening 261 in the BARC 233 and the tapered S/D contact opening 263 in the dielectric layer 232 permits the photoresist contact opening 237 to be larger for a given contact opening 262 so both the Develop Inspection Critical Dimension (DICD) and the Final Inspection Critical Dimension (FICD) are enlarged for a given line geometry.

Figure 4D:
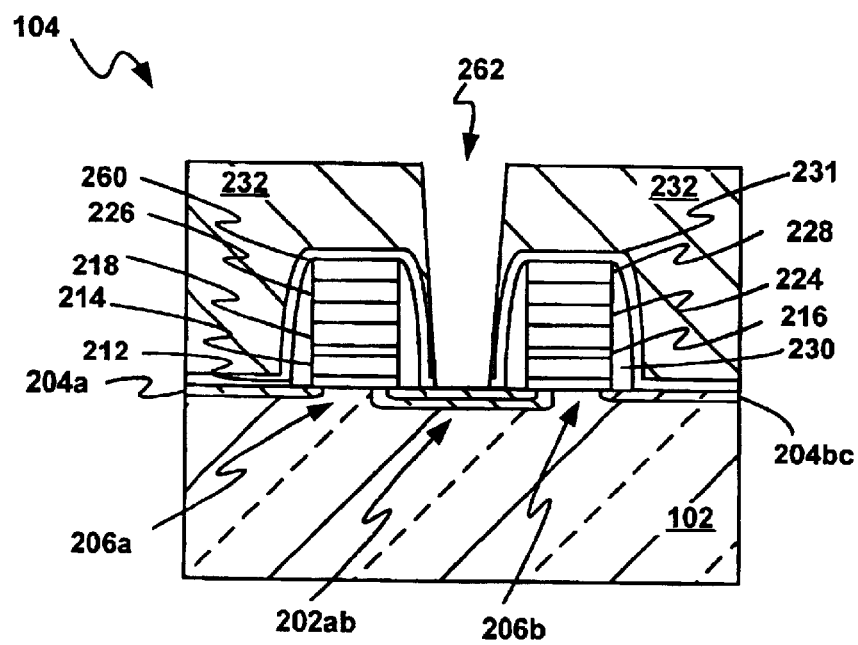

FIG. 4D shows the removal of the photoresist 235, the BARC 233, and the dielectric liner layer 231 over the S/D contact 202*ab*. This removal step allows the photoresist contact opening 237 to be closer to other similar openings without causing contacts which are so close together that they short together.

Figure 4E:
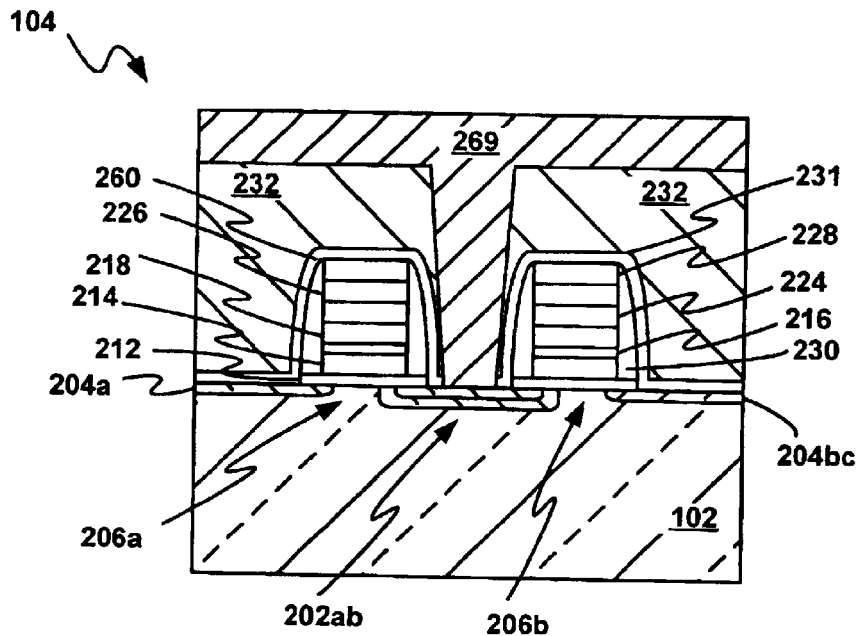

FIG. 4E shows the deposition of a conductive material to form a conductive layer 269 over the dielectric layer 232. The conductive material fills the contact opening 262. In this embodiment, the conductive material is tungsten and may be formed using conventional metal deposition techniques, such as CVD and/or physical vapor deposition (PVD). Other conductive materials can be used. Thin barrier materials (not shown), such as titanium (Ti)/titanium nitride (TiN) or tantalum (Ta)/tantalum nitride (TaN), may be deposited to coat the walls of the contact opening 262 prior to the deposition of the conductive material to ensure good adhesion and minimize diffusion of the conductive material through the walls of the contact opening 262 or into the underlying common source 202*ab*.

Figure 4F:
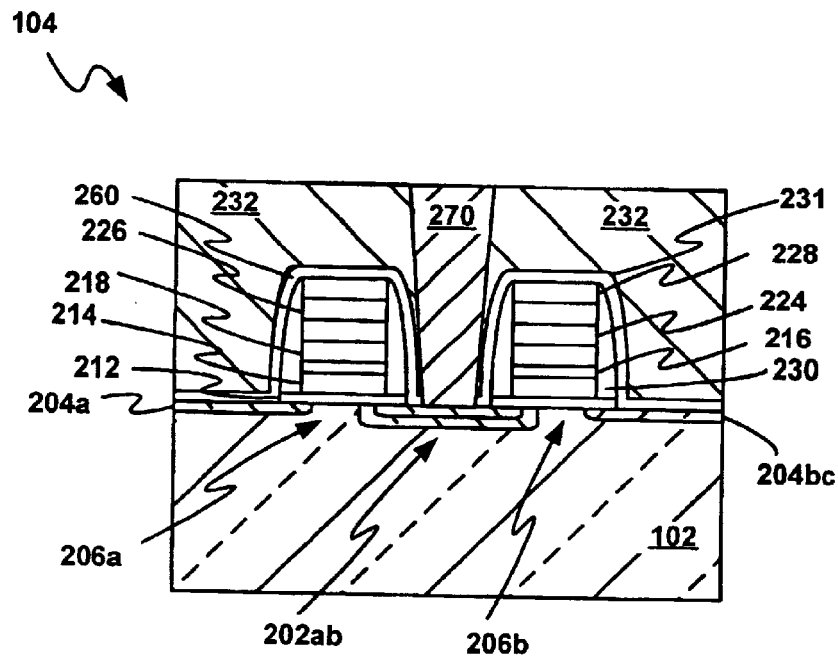

FIG. 4F shows the removal and planarization of the tungsten material above the oxide layer 232 using for example, tungsten chemical-mechanical planarization technique. The tungsten material is planarized until it is flush with the top surface of the dielectric layer 232.

In production, a plurality of stacked gate structures is formed on a semiconductor substrate 102 using conventional techniques as shown in FIG. 4A. For simplicity of illustration, only two stacked gate structures, 210*a* and 210*b*, are shown. The common source 202*ab* is formed between the two stacked gate structures 210*a* and 210*b*. Drains 204*a* and 204*bc* are formed on the semiconductor substrate 102 and are spaced apart from the common source 202*ab* by channel regions 206*a* and 206*b*, respectively. The sidewall spacers 230 are formed around the stacked gate structures 210*a* and 210*b*. The sidewall spacers 230 are formed using conventional deposition and etching techniques.

In this embodiment, each of the stacked gate structures (210*a* or 210*b*) includes the gate dielectric layer 212, the floating gate 214 disposed on the gate dielectric layer 212, the interpoly (inter-gate) dielectric layer 216 disposed on the floating gate 214, the control gate 218 overlying the interpoly dielectric 216, the silicide layer 224 disposed on the control gate 218, the polysilicon (poly cap) layer 226 disposed on the silicide layer 224, and the silicon oxynitride layer 228 disposed on the poly cap layer 226.

Next, the dielectric liner layer 231 is formed over the entire semiconductor substrate 102, including the stacked gate structures 210*a* and 210*b*, sidewall spacers 230, common source 202*ab*, and drains 204*a* and 204*bc*, using high temperature oxidation or plasma enhanced chemical vapor deposition (PECVD) (FIG. 4A).

This is followed by the deposition of the BARC 233 and the photoresist 235. The photoresist 235 is subjected to a photolithographic patterning and developing process to form the photoresist contact opening 237 (FIG. 4B).

Next, the source/drain (S/D) contact opening 262 is formed in the dielectric layer 232 using the photoresist 235 and the BARC 233 as a mask to expose portions of the common source 202*ab* (FIG. 4C). As explained above, the etch process with high selectivity is used to form the contact opening 262 to minimize etching of the sidewall spacers 230 and the underlying substrate 102. It should be noted that the dielectric liner layer 231 located above the common source 202*ab* and portions of the dielectric liner layer 231 on the sidewall spacers 230 are removed during this etch process.

Thereafter the photoresist 235 and the BARC 233 are removed using conventional stripping techniques (FIG. 4D).

After the removal of the photoresist 235 and the BARC 233, the conductive material is deposited over the dielectric layer 232 to form the conductive layer 269. The conductive material fills the contact opening 262 (FIG. 4E). In one embodiment, the conductive material is tungsten and is formed using conventional metal deposition techniques.

After the formation of the contact 270, conductive material above the dielectric layer 232 is removed using a planarization technique, such as chemical-mechanical polishing (FIG. 4F).

Therefore, the present invention provides a method for shrinking a semiconductor device and enlarging the FICD.

While the best mode utilizes tungsten as the conductive material for filling contact openings, it should be understood that the present invention is applicable to other materials selected from a group consisting of tantalum, titanium, copper, aluminum, gold, silver, alloys thereof, and compounds thereof.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A method of manufacturing a semiconductor device on a semiconductor substrate, comprising the steps of:

forming a pair of multi-layer structures on an active region on the semiconductor substrate;

forming sidewall spacers around the pair of multi-layer structures;

forming a dielectric liner layer over the semiconductor substrate, including the pair of multi-layer structures the sidewall spacers, the dielectric liner layer in contact with the active region;

forming a dielectric layer over the dielectric liner layer;

forming a photoresist over the dielectric layer;

pattering and developing the photoresist to form a photoresist contact opening therein;

forming a first tapered contact opening, using the photoresist contact opening, into the dielectric layer, forming the first tapered contact opening with a bottom opening smaller than the photoresist contact opening;

forming a second tapered contact opening, using the first tapered contact opening, into the dielectric liner layer forming the second tapered contact opening with a bottom opening open to the active region for a smaller region than the active region with which the dielectric liner layer is in contact;

removing the photoresist; and forming a conductive material in the first and second tapered contact openings to form a contact in contact with the active region, the dielectric liner layer, and the dielectric layer.

2. The method as claimed in claim 1 including a step of forming a bottom anti-reflecting coating on the dielectric layer before forming the photoresist over the dielectric layer to assist in patterning the photo-resist.

3. The method as claimed in claim 1 including forming a bottom anti-reflective coating on the dielectric layer and forming a tapered opening therein which is used in forming the tapered contact opening.

4. The method as claimed in claim 1 wherein forming a tapered contact opening uses an etching process.

5. The method as claimed in claim 1 wherein forming a conductive material includes: depositing the conductive metal over the dielectric layer and in the tapered contact opening; and planarizing the conductive metal flush with the dielectric layer.

6. A method of manufacturing a semiconductor device on a semi-conductor substrate, comprising:

forming a pair of multi-layer structures on an active region on the semiconductor substrate;

forming sidewall spacers around the pair of multi-layer structures;

implanting source and drain regions in the active region adjacent the sidewall spacers;

depositing a dielectric liner layer of silicon nitride over the semiconductor substrate, in contact with the multi-layer structure, the sidewall spacers, the source region and drain region;

depositing a dielectric layer of silicon oxide on the dielectric liner layer;

depositing a bottom anti-reflective coating over the dielectric layer;

depositing a photoresist over the bottom anti-reflective coating;

photolithographically patterning and developing the photoresist to form a photoresist contact opening therein;

etching an anti-reflective coating tapered opening in the bottom anti-reflective coating using the photoresist contact opening, forming the anti-reflective coating tapered contact opening with a bottom opening smaller than the photoresist contact opening;

etching a first tapered contact opening through the dielectric layer using the bottom anti-reflective coating, forming the first tapered contact opening with a bottom opening smaller than the bottom opening of the anti-reflective coating tapered contact opening;

etching a second tapered contact opening through the dielectric liner layer using the dielectric layer, forming the second tapered contact opening with a bottom opening open to the source and drain regions for a smaller region than the source and drain region with which the dielectric liner layer is in contact;

removing the photoresist;

removing the bottom anti-reflective coating; and depositing a conductive material in the first and second tapered contact openings to form a contact.

7. The method as claimed in claim 6 including a step of depositing a bottom anti-reflecting coating of silicon oxynitride on the dielectric layer before forming the photoresist over the dielectric layer for assisting in the patterning of the photoresist.

8. The method as claimed in claim 6 including depositing a bottom anti-reflective coating of silicon oxy-nitride on the dielectric layer.

9. The method as claimed in claim 6 wherein etching a tapered contact opening uses a semi-isotropic etching process.

10. The method as claimed in claim 6 wherein depositing a conductive material includes: depositing the conductive metal over the dielectric layer and in the tapered contact opening, the conductive metal selected from a group consisting of tungsten, tantalum, titanium, copper, aluminum, gold, silver, alloys thereof, and compounds thereof; and planarizing the conductive metal flush with the dielectric layer.

* * * * *

UNITED STATES PATENT AND TRADEMARK OFFICE
CERTIFICATE OF CORRECTION

PATENT NO. : 6,878,622 B1
DATED : April 12, 2005
INVENTOR(S) : Yang et al.

It is certified that error appears in the above-identified patent and that said Letters Patent is hereby corrected as shown below:

Column 2,
Line 62, delete "(SID)" and insert therefor -- (S/D) --

Column 6,
Line 11, delete "(SID)" and insert therefor -- (S/D) --

Column 8,
Line 2, delete "(SID)" and insert therefor -- (S/D) --

Column 9,
Line 46, delete "pattering" and insert therefor -- patterning --
Line 55, delete "layer" and insert therefor -- layer, --

Signed and Sealed this

Fifth Day of July, 2005

JON W. DUDAS
*Director of the United States Patent and Trademark Office*